US012812894B2

(12) United States Patent
Canizares

(10) Patent No.: US 12,812,894 B2
(45) Date of Patent: Nov. 24, 2026

(54) HETEROJUNCTION STRUCTURE WITH VARYING LAYER COMPOSITION

(71) Applicant: Infineon Technologies Canada Inc., Ottawa (CA)

(72) Inventor: Claudio Andres Canizares, Morgan Hill, CA (US)

(73) Assignee: Infineon Technologies Canada Inc., Ottawa (CA)

( * ) Notice: Subject to any disclaimer, the term of this patent is extended or adjusted under 35 U.S.C. 154(b) by 528 days.

(21) Appl. No.: 18/320,063

(22) Filed: May 18, 2023

(65) Prior Publication Data

US 2024/0387718 A1 Nov. 21, 2024

(51) Int. Cl.

| | |
|---|---|
| ***H10D 62/00*** | (2026.01) |
| ***H10D 30/47*** | (2025.01) |
| ***H10D 62/17*** | (2025.01) |
| ***H10D 62/85*** | (2025.01) |

(52) U.S. Cl.

CPC ......... *H10D 30/475* (2025.01); *H10D 62/328* (2025.01); *H10D 62/8503* (2025.01)

(58) Field of Classification Search

CPC ............. H10D 62/8503; H10D 62/852; H10D 30/475; H10D 30/4732

See application file for complete search history.

(56) References Cited

U.S. PATENT DOCUMENTS

| | | | |
|---|---|---|---|
| 2009/0008678 | A1 | 1/2009 | Ando et al. |
| 2015/0056764 | A1 | 2/2015 | Brown et al. |
| 2024/0063302 | A1 | 2/2024 | Cheng |

FOREIGN PATENT DOCUMENTS

| | | | |
|---|---|---|---|
| CN | 115411104 | A | 11/2022 |
| JP | 2003151996 | A | 5/2003 |

OTHER PUBLICATIONS

European Search Report received for Application No./patent No. (24176252.5-1211)(WN#22520.17b) Oct. 18, 2024. 10 pages.

Sung Park Pil et al: "Electron gas dimensionality engineering in AlGaN/GaN high electron mobility transistors using polarization" Applied Physics Letters, American Institute of Physics, 2 Huntington Quadrangle, Melville, NY 11747, vol. 100, No. 6, (Feb. 6, 2012). 4 Pages.

*Primary Examiner* — Reema Patel

(74) *Attorney, Agent, or Firm* — WORKMAN NYDEGGER

(57) ABSTRACT

A heterojunction structure in which a barrier semiconductor layer is epitaxially grown on a channel semiconductor layer but varying a composition of the barrier semiconductor layer for at least part of the epitaxial growth of the barrier semiconductor layer. By so doing, in some cases, a free electron density in planar view of the 2DEG may be increased thereby allowing for greater current flow for a given voltage difference. Furthermore, for a given current, the mobility of the electrons is increased, thus reducing the on resistance of transistors that include the 2DEG as a channel region. This further improves power efficiency of the transistor, and reduces heat generated by the transistor at a given power.

13 Claims, 7 Drawing Sheets

HETEROJUNCTION STRUCTURE WITH VARYING LAYER COMPOSITION

BACKGROUND

Electronic circuits typically include transistors, which function as electronic switches that regulate or control current flow in portions of the circuit. One type of transistor is a field-effect transistor in which a voltage is applied to a gate terminal to turn the transistor on and off. A semiconductor channel region is disposed between the drain terminal and the source terminal. When the transistor is on, current flows through the semiconductor channel region between the source terminal and the drain terminal. When the transistor is off, lesser or no current flows through the semiconductor channel region between the source terminal and the drain terminal. The gate terminal is disposed over the semiconductor channel region between the source terminal and the drain terminal. Voltage on the gate terminal generates a field that affects whether the semiconductor channel region conducts current-hence the term "field-effect transistor".

Silicon has traditionally been used to fabricate transistors. However, wider bandgap semiconductor material may be used to fabricate transistors that conduct higher power and operate at higher efficiency than silicon transistors. Silicon carbide (SiC), Aluminum Nitride (AlN), Zinc Oxide (ZnO), and Gallium Nitride (GaN) are each examples of wide bandgap semiconductor materials that can be used in power electronics. One way to use such wider bandgap semiconductor materials is to form two layers of different semiconductor materials to therebetween form a heterojunction.

These two semiconductor materials may have sufficiently different bandgaps such that when brought together, the joined bandgap drops below the Fermi level just within the channel layer. This means that electrons may freely flow within this region. This region is thin in depth and forms a plane parallel to the upper surface of the channel region. Thus, this region is called a "2DEG" region to emphasize its planar form. Furthermore, this region is also referred to as a 2DEG "sea of electrons" or 2DEG "electron gas" due to the high mobility of electrons in this region. Thus, the 2DEG region is highly conductive. The 2DEG region may form the channel region of a power semiconductor to allow passage of high currents with relatively low resistance.

A 2DEG region can be formed in the heterostructures of certain semiconductor pairs that have different bandgaps and band alignments. These pairs typically include a wide bandgap material and a narrow bandgap material. The formation of a 2DEG region depends on the specific properties of the materials, such as the lattice constant, electron affinity, and band offset.

The subject matter claimed herein is not limited to embodiments that solve any disadvantages or that operate only in environments such as those described above. Rather, this background is only provided to illustrate one exemplary technology area where some embodiments described herein may be practiced.

BRIEF SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Embodiments described herein relate to a heterojunction structure in which a barrier semiconductor layer is epitaxially grown on a channel semiconductor layer but while varying an element composition of the barrier semiconductor layer for at least part of the epitaxial growth of the barrier semiconductor layer. By so varying the composition, in some cases, a free electron density in planar view of the 2DEG may be increased thereby allowing for greater current flow for a given voltage difference. Furthermore, for a given current, the mobility of the electrons is increased, thus reducing the on-resistance of transistors that include the 2DEG as a channel region. This further improves the power efficiency of the transistor and reduces heat generated by the transistor at a given power.

Additional features and advantages will be set forth in the description which follows, and in part will be obvious from the description, or may be learned by the practice of the teachings herein. Features and advantages of the invention may be realized and obtained by means of the instruments and combinations particularly pointed out in the appended claims. Features of the present invention will become more fully apparent from the following description and appended claims, or may be learned by the practice of the invention as set forth hereinafter.

BRIEF DESCRIPTION OF THE DRAWINGS

In order to describe the manner in which the above-recited and other advantages and features can be obtained, a more particular description of the subject matter briefly described above will be rendered by reference to specific embodiments which are illustrated in the appended drawings. Understanding that these drawings depict only typical embodiments and are not therefore to be considered to be limiting in scope, embodiments will be described and explained with additional specificity and detail through the use of the accompanying drawings in which.

DETAILED DESCRIPTION

Embodiments described herein relate to a heterojunction structure in which a barrier semiconductor layer is epitaxially grown on a channel semiconductor layer but while varying an element composition of the barrier semiconductor layer for at least part of the epitaxial growth of the barrier semiconductor layer. By so varying the composition, in some cases, a free electron density in planar view of the 2DEG may be increased thereby allowing for greater current flow for a given voltage difference. Furthermore, for a given current, the mobility of the electrons is increased, thus reducing the on-resistance of transistors that include the 2DEG as a channel region. This further improves the power efficiency of the transistor and reduces heat generated by the transistor at a given power.

Figure 1:
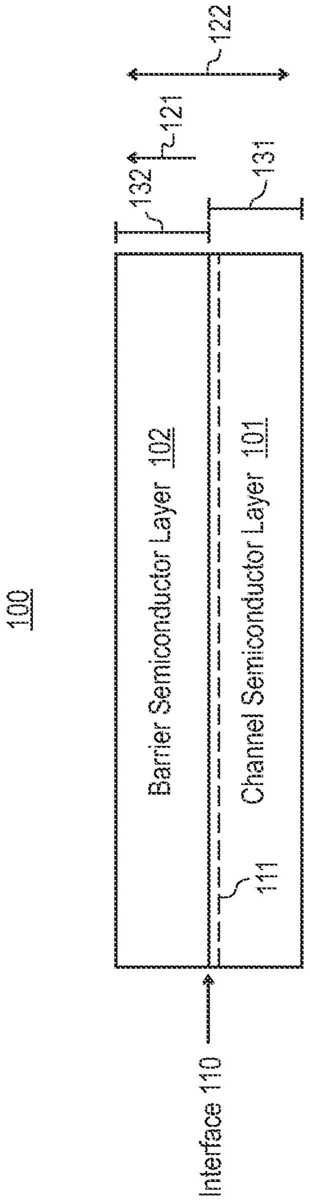
FIG. 1 illustrates a cross-sectional view of a heterojunction structure that includes two semiconductor layers.

FIG. 1 illustrates a cross-sectional view of a heterojunction structure 100 that includes two semiconductor layers 101 and 102. The second semiconductor layer 102 is epitaxially grown on the first semiconductor layer 101 and is formed of a second semiconductor material. The first semiconductor layer 101 may likewise have been epitaxially grown on a previous layer in an epitaxial stack, but for now, only the first semiconductor layer 101 and the second semiconductor layer 102 are shown. The first semiconductor layer 101 will also be referred to herein as a "channel" semiconductor layer 101, and the second semiconductor layer 102 will also be referred to herein as a "barrier" semiconductor layer 102. There is an interface 110 between the channel semiconductor layer 101 and the barrier semiconductor layer 102.

The channel semiconductor layer 101 is formed of a first semiconductor material. That first semiconductor material may be a first composite material that comprises multiple different elements. The barrier semiconductor layer 102 is composed of a second composite material that also comprises multiple different elements. The channel semiconductor layer 101 and the barrier semiconductor layer 102 are formed of different semiconductor materials with different bandgap levels such that the interface 110 between the channel semiconductor layer 101 and the barrier semiconductor layer 102 is a heterojunction, and such that a 2DEG 111 is formed just inside the upper end of the channel semiconductor layer 101 (just below the interface 110).

The direction of epitaxial growth is upwards in the view of FIG. 1, and is represented by the upward-facing arrow 121, which may also be referred to as the "epitaxial growth direction". Alternatively, because the vertical direction is often represented as the epitaxial growth direction in cross-sectional drawings herein, the epitaxial growth direction will also be referred to as "upwards" or "vertically upwards". An axis 122 that is parallel to the epitaxial growth direction will also be referred to as the "epitaxial axis" or the "vertical axis". Furthermore, positions along the epitaxial axis 122 may also be referred to as a "vertical position". Directions parallel to the epitaxial axis 122 will also be referred to as the "vertical direction". Orientations parallel to the epitaxial axis 122 will also be referred to herein as "vertical". A depth within a given layer in the epitaxial growth direction will also be referred to herein as an "epitaxial depth" even though the "depth" is measured from the bottom of the layer that was or is being epitaxially grown.

The channel semiconductor layer 101 has a thickness 131 in the vertical direction. The barrier semiconductor layer 102 has a thickness 132 in the vertical direction. The principles described herein are not limited to the thickness of either the channel semiconductor layer 101 or the barrier semiconductor layer 102. However, whatever the thickness of the barrier semiconductor material, for at least some of the thickness of the barrier semiconductor layer 102, a composition percentage of at least some of the multiple different elements of composite semiconductor material of that barrier semiconductor layer 102 changes depending on an epitaxial depth within the barrier semiconductor layer. By designing the composition to be variable across at least some of the thickness of the barrier semiconductor layer 102, the ability of the 2DEG 111 (induced within the channel semiconductor layer 101) to carry current may be increased as compared to keeping the composition fixed across that same portion of the barrier semiconductor layer 102.

Figure 2:
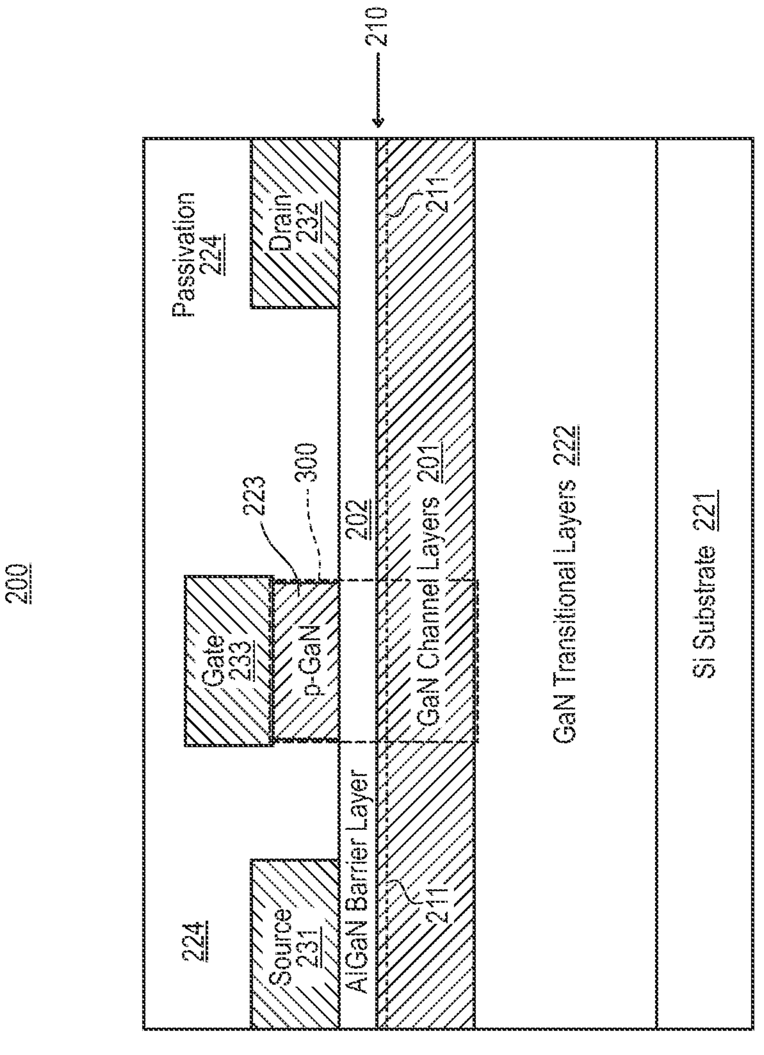
FIG. 2 shows an off state of the HEMT transistor in which the 2DEG is not present underneath the gate terminal.

FIG. 2 illustrates a cross-sectional view of a High Electron Mobility Transistor (HEMT) transistor 200 which is an example of an environment in which the heterojunction structure 100 of FIG. 1 may be used to generate a 2DEG electron gas. In particular, in FIG. 2, GaN channel layers 201 are collectively an example of the channel semiconductor layer 101 of FIG. 1, the AlGaN barrier layer 202 is an example of the barrier semiconductor layer 102 of FIG. 1, the interface 210 between the GaN channel layer 201 and the AlGaN barrier layer 202 is an example of the interface 110 of FIG. 1, and the 2DEG 211 is an example of the 2DEG 111 of FIG. 1.

The HEMT transistor 200 uses the 2DEG 211 to conduct electricity between a source terminal 231 and a drain terminal 232 depending on a voltage applied to a gate terminal 233. When an on-voltage is applied to the gate terminal 233, the 2DEG 211 is continuous between the source terminal 231 and the drain terminal 232 thereby causing the HEMT transistor 200 to be on since electricity may freely flow between the source terminal 231 and the drain terminal 232. In contrast, when an off-voltage is applied to the gate terminal 233, a discontinuity is created in the 2DEG 211, thereby turning the HEMT transistor 200 off. FIG. 2 shows an off state of the HEMT transistor 200 in which the 2DEG 211 is not present underneath the gate terminal 233.

To complete the description of the HEMT transistor 200, the HEMT transistor 200 also includes a silicon (Si) substrate 221 having a top surface that is in a <111> planar orientation and that serves as a structural foundation for the HEMT 200. GaN transitional layers 222 are next formed on the Si substrate 221 and serves to perform strain management by intermediating between the lattice parameter of the GaN channel layer 201 as compared to the lattice parameter of the Si substrate 221. A p-doped GaN portion 223 serves to apply the voltage that is applied at the gate terminal 213 also to the p-doped GaN portion 223. A passivation layer 224 provides electrical and mechanical protection to the HEMT transistor 200.

Figure 3:
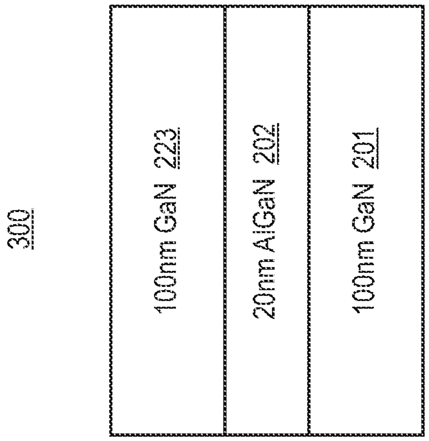
FIG. 3 illustrates a closeup view of portion of the HEMT transistor of FIG. 2.

FIG. 3 illustrates a closeup view of portion 300 of the HEMT 200. In this particular example, the thickness of the AlGaN barrier layer 202 is 20 nanometers (nm). The thicknesses of the GaN channel layer 201 and the p-doped GaN portion 223 are each 100 nm in this example. Again, the principles described herein are not limited to the precise thickness of these layers. However, the thickness of 20 nm in the AlGaN barrier layer 202 is specifically mentioned to provide a proper correlation with FIGS. 4A through 4C and FIGS. 6A through 6C.

Figure 4C:
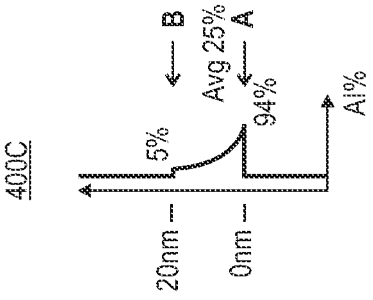
FIGS. 4A through 4C each illustrate example composition profile diagrams, where the vertical axis represents a vertical position in the structure of FIG. 3, and where the horizontal position represents a percentage of Aluminum Al present within the semiconductor material at that corresponding vertical position.
Figure 4B:
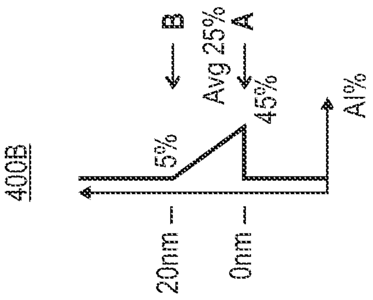
Figure 4A:
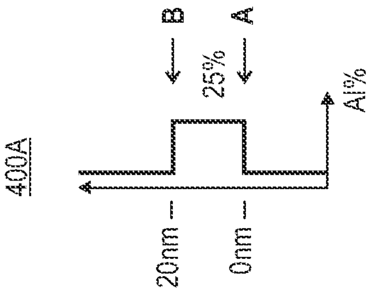
FIG. 4A (PRIOR ART)

FIGS. 4A through 4C each illustrate example composition profile diagrams 400A, 400B, and 400C, where the vertical axis represents a vertical position in the structure of FIG. 3, and where the horizontal position represents a percentage of Aluminum Al present within the semiconductor material at that corresponding vertical position. Position A represents a vertical position at the bottom of the AlGaN barrier layer 202 and corresponds to a depth in the AlGaN barrier layer 202 of 0 nm. Position B represents a vertical position at the top of the AlGaN barrier layer 202 and corresponds to a depth in the AlGaN barrier layer 202 of 20 nm, being at the very top of the AlGaN barrier layer 202, which in this example is 20 nm thick. FIGS. 4A through 4C are each mutually exclusive as any given structure will have one and only one composition profile for Aluminum.

FIG. 4A illustrates a prior art composition in which the AlGaN layer has 25 percent aluminum, which is a fixed component percentage throughout the entire depth of the AlGaN layer. FIG. 5A illustrates a combined bandgap and free electron density simulation diagram 500A that shows a simulation result for the electrical behavior of the structure 300 of FIG. 3 if the structure 300 of FIG. 3 has an Aluminum content composition of the composition profile diagram 400A of FIG. 4A.

In accordance with the principles described herein, a component percentage of multiple components of the barrier semiconductor layer is varied across at least some of the depth of the barrier semiconductor layer. For example, referring to the composition profile diagram in FIG. 4B, the component percentage of Aluminum in the AlGaN layer linearly declines from 45 percent to 5 percent. Through simulations, the inventor has discovered by that by so varying the component percentage, the simulated free electron peak of the composition profile of FIG. 4B increased as compared to the simulated free electron peak using the Aluminum composition profile of FIG. 4A.

The average Aluminum in each of the barrier semiconductor layers was kept the same (at 25%) to demonstrate that a 2DEG region may be created having a greater capacity to carry current by varying the composition of Aluminum. That is, the overall strain of the barrier semiconductor layer was kept approximately the same since the barrier semiconductor layer is relatively thin, and since the average Aluminum content in FIG. 4B is the same as that of FIG. 4A. The increase in strain near the lower semiconductor layer also means that the piezoelectric contribution to the 2DEG is greater than the layers shown in FIG. 4A, resulting in the increase in the 2DEG density increase.

In FIG. 4B, the composition of Aluminum was permitted to decline linearly with depth in the barrier semiconductor layer. However, in FIG. 4C, the aluminum composition is permitted to decline non-linearly. For instance, the decline takes the form of an exponential decay function that begins at 94% at the bottom of the barrier semiconductor layer and ends at 5% at the top of the barrier semiconductor layer. Through simulations, the inventor has discovered that the simulated free electron peak of the composition profile of FIG. 4A is higher than the simulated free electron peak of the composition profile of FIG. 4A, and is even higher than the simulated free electron peak of the composition profile of FIG. 4B.

The precise optimal composition profile of a barrier semiconductor layer will depend on what the compound semiconductor material of the barrier semiconductor layer is, and what the compound semiconductor material of the channel semiconductor material is. While an example is presented in which the barrier semiconductor layer is AlGaN containing Aluminum (Al), Gallium (Ga) and Nitrogen (N) and the proportion of Al in decreased with depth (with necessarily decreasing Ga with depth), on a channel semiconductor layer of GaN containing Ga and N, the principles described herein are not limited to these compound semiconductor materials. As an example only of other alternatives, the channel semiconductor layer might be InGaN, while the barrier semiconductor layer might be InAlGaN in which the composition of at least two of In, Al and Ga is changed with depth in the barrier semiconductor layer.

Figure 5:
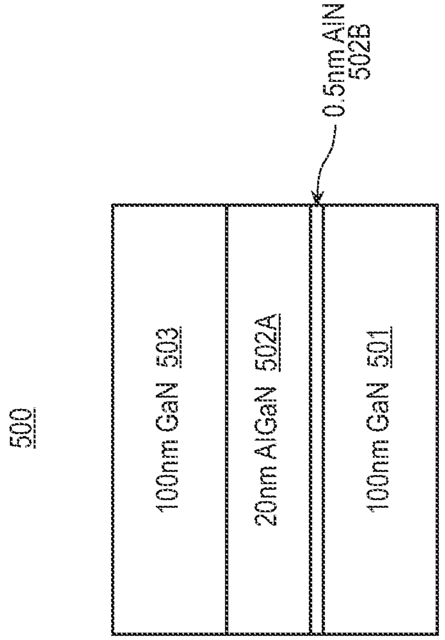
FIG. 5 illustrates a cross-sectional diagram of a structure which is an alternative structure to the structure of FIG. 3.

FIG. 5 illustrates a cross-sectional diagram of a structure 500 which is an alternative structure to structure 300 of FIG. 3. The structure 500 of FIG. 5 is the same as the structure 300 of FIG. 3, except for the presence of a thin AlN insert layer 502A that is 0.5 nm thick. Specifically, the GaN channel layers 501 may be the same as described above for the GAN channel layers 201 of FIG. 2, the AlGaN barrier layer 502B may be the same as described above for the AlGaN barrier layer 202 of FIG. 2, and the p-doped GaN portion 503 may be the same as described above for the p-doped GaN portion 223 of FIG. 2. However, there is an AlN insert layer 502A that was epitaxially deposited on the GaN channel layers 501, and on which the AlGaN barrier layer 502B was epitaxially deposited. The AlN insert layer 502A is conventionally used to increase the free electron density in the resulting 2DEG. However, as will be shown with respect to FIGS. 6A through 6C, the principles described herein may be used to even further increase the free electron density of the resulting 2DEG. The combination of the AlN insert layer 502A and the AlGaN barrier layer 502B may be considered as a combined AlGaN layer that is 20.5 nm thick, but in which the first 0.5 nm is all AlN, and no GaN.

Figure 6A:
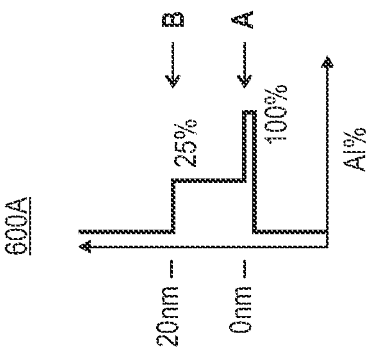
FIG. 6A (PRIOR ART)
FIGS. 6A through 6C each illustrate example composition profile diagrams, where the vertical axis represents a vertical position in the structure of FIG. 3, and where the horizontal position represents a percentage of Aluminum Al present within the semiconductor material at that corresponding vertical position, and in alternative variation in which there is an insert layer between the barrier layer and the channel layer.

FIG. 6A illustrates a prior art composition profile 600A in which the AlGaN barrier layer has 25 percent aluminum, which is a fixed component percentage throughout the entire 20 nm depth of the AlGaN barrier layer. A 100% composition is shown just below the AlGaN barrier layer reflecting the presence of the AlN insert layer.

Figure 6B:
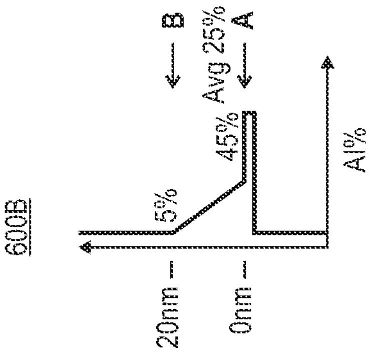

However, FIG. 6B shows a composition profile 600B that is comparable to the combined simulation results diagram 400B of FIG. 4C. The composition profile 600B of FIG. 6B is the same as the composition profile 400B of FIG. 4B, except with the presence of the AlN insert layer. By using simulations, the inventor has discovered that varying of the Al content linearly in the AlGaN barrier layer did indeed increase the predicted free electron density of the 2DEG electron gas.

Figure 6C:
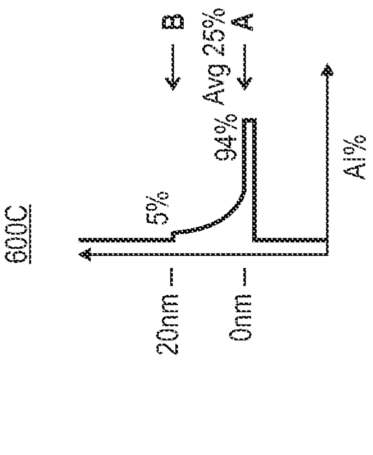

FIG. 6C shows a composition profile 600C that is comparable to the combined simulation results diagram 400C of FIG. 4C. The composition profile 600C of FIG. 6C is the same as the composition profile 400C of FIG. 4C, except with the presence of the AlN insert layer. The inventor has again discovered that varying of the Al content non-linearly in such a manner in the AlGaN barrier layer did indeed increase the predicted free electron density of the 2DEG electron gas.

Figure 7:
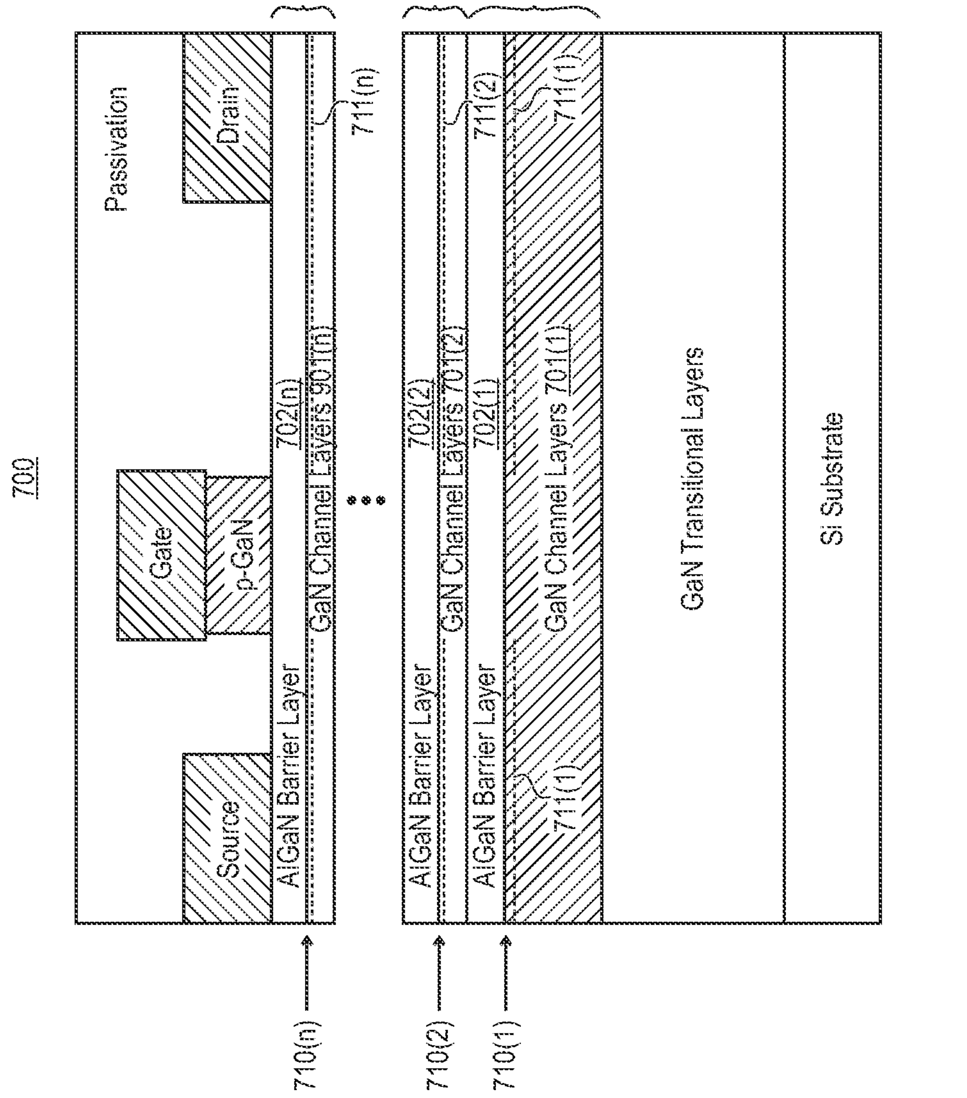
FIG. 7 illustrates a HEMT in which there are multiple heterojunctions.

Up until this point, a transistor structure has been described in which there is a heterojunction between a barrier layer and a channel layer that defines a single 2DEG plane. However, the principles described herein may also be applied where there are multiple heterojunctions defining multiple 2DEG planes. For instance, FIG. 7 illustrates a HEMT 700 in which there are n heterojunctions 710(1), 710(2) through 710(*n*) (where n is any plural integer). Each heterojunction 710(*k*) (where k is any integer between 1 and n, inclusive), is defined by the interface between an upper AlGaN barrier layer 702(*k*) and lower GaN channel layers 701(*k*), and induces a respective plane of 2DEG 711(*k*). The composition profile in each barrier layer 702(*k*) may be selected uniquely from the composition of other barrier layers so as to obtain a described 2DEG electron density at each level, to thereby optimize the performance of the HEMT 700.

In FIG. 7, each channel layer is composed of GaN and each barrier layer is composed of AlGaN. However, the principles described herein may also be applied if the component elements of barrier layers are different from each other. For instance, there might be one barrier layer composed of AlGaN and another barrier layer composed of AlInGaN. Furthermore, the principles described herein may also be applied if the component elements of the channel layers are different from each other. Furthermore, in the description above, the element composition profile of the barrier layer is varied with thickness to increase the 2DEG free electron density. However, alternatively or in addition, the element composition profile of the channel layer may be varied with thickness to increase the 2DEG free electron density.

Literal Support Section

Clause 1. A heterojunction structure comprising an epitaxial stack the comprises: a channel semiconductor layer formed of a first semiconductor material; and a barrier semiconductor layer epitaxially deposited on the channel semiconductor layer to form a heterojunction between the channel semiconductor layer and the barrier semiconductor layer; the barrier semiconductor layer formed of a second semiconductor material that is a compound semiconductor material comprising multiple different elements, wherein for at least some of the thickness of the barrier semiconductor layer, a composition percentage of at least some of the multiple different elements changes depending on an epitaxial depth within the barrier semiconductor layer.

Clause 2. The heterojunction structure in accordance with Clause 1, the first semiconductor material being GaN, the second semiconductor material being AlGaN.

Clause 3. The heterojunction structure in accordance with Clause 1, the first semiconductor material being GaN, the second semiconductor material being AlInGaN.

Clause 4. The heterojunction structure in accordance with Clause 1, the composition percentage changing linearly with the epitaxial depth within the barrier semiconductor layer for at least some of the epitaxial depth of the barrier semiconductor layer.

Clause 4. The heterojunction structure in accordance with Clause 1, the composition percentage changing linearly with the epitaxial depth within the barrier semiconductor layer for at least some of the epitaxial depth of the barrier semiconductor layer.

Clause 5. The heterojunction structure in accordance with Clause 4, the composition percentage changing linearly with the epitaxial depth within the barrier semiconductor layer for all of the epitaxial depth of the barrier semiconductor layer.

Clause 6. The heterojunction structure in accordance with Clause 4, the composition percentage changing linearly with the epitaxial depth within the barrier semiconductor layer for only some of the epitaxial depth of the barrier semiconductor layer.

Clause 7. The heterojunction structure in accordance with Clause 4, the composition percentage changing linearly with the epitaxial depth within the barrier semiconductor layer for the epitaxial depth of the barrier semiconductor layer except at a portion that is most proximate the channel semiconductor layer.

Clause 8. The heterojunction structure in accordance with Clause 1, the composition percentage changing non-linearly with the epitaxial depth within the barrier semiconductor layer for at least some of the epitaxial depth of the barrier semiconductor layer.

Clause 9. The heterojunction structure in accordance with Clause 8, the composition percentage changing non-linearly with the epitaxial depth within the barrier semiconductor layer for all of the epitaxial depth of the barrier semiconductor layer.

Clause 10. The heterojunction structure in accordance with Clause 8, the composition percentage changing non-linearly with the epitaxial depth within the barrier semiconductor layer for only some of the epitaxial depth of the barrier semiconductor layer.

Clause 11. The heterojunction structure in accordance with Clause 8, the composition percentage changing non-linearly with the epitaxial depth within the barrier semiconductor layer for the epitaxial depth of the barrier semiconductor layer except at a portion that is most proximate the channel semiconductor layer.

Clause 12. The heterojunction structure in accordance with Clause 1, the compound semiconductor material of the second semiconductor material being a second compound semiconductor material, the first semiconductor material formed of a first compound semiconductor material comprising multiple different elements, wherein for at least some of the thickness of the channel semiconductor layer, a composition percentage of at least some of the multiple different elements of the first compound semiconductor material changes depending on an epitaxial depth within the barrier semiconductor layer.

Clause 13. The heterojunction structure in accordance with Clause 1, the channel semiconductor layer being a first channel semiconductor layer, the barrier layer being a first barrier semiconductor layer, the heterojunction comprising a first heterojunction, the epitaxial stack of the heterojunction structure further comprising: a second semiconductor channel layer formed of a third semiconductor material; and a second barrier semiconductor layer epitaxially deposited on the second channel semiconductor layer to form a second heterojunction between the second channel semiconductor layer and the second barrier semiconductor layer; the second barrier semiconductor layer formed of a fourth semiconductor material that is a compound semiconductor material comprising multiple different elements, wherein for at least some of the thickness of the second barrier semiconductor layer, a composition percentage of at least some of the multiple different elements of the second barrier semiconductor layer changes depending on an epitaxial depth within the second barrier semiconductor layer.

Clause 14. The heterojunction structure in accordance with Clause 13, the third semiconductor material and the first semiconductor material being a same first compound semiconductor material with the same or different component percentages, the second semiconductor material and the fourth semiconductor material being a same second compound semiconductor material.

Clause 15. The heterojunction structure in accordance with Clause 14, a component percentage of at least some of multiple elements of the second compound semiconductor material varying with epitaxial depth in the first barrier layer in a different manner as a component percentage of the at least some of the multiple elements of the second compound semiconductor material varies with epitaxial depth in the second barrier semiconductor layer.

Clause 16. A method for forming a heterojunction structure that is composed of an epitaxial stack, the method comprising: an act of forming a channel semiconductor layer composed of a first semiconductor material; and an act of epitaxially growing a barrier semiconductor layer on the channel semiconductor layer to form a heterojunction between the channel semiconductor layer and the barrier semiconductor layer, the barrier semiconductor layer formed of a second semiconductor material that is a compound semiconductor material comprising multiple different elements, wherein for at least part of the epitaxial growth of the barrier semiconductor layer, a composition of at least some of the multiple different elements is adjusted so as to vary with time of epitaxial growth.

Clause 17. The method in accordance with Clause 16, the first semiconductor material being GaN, the second semiconductor material being AlGaN.

Clause 18. The method in accordance with Clause 16, the first semiconductor material being GaN, the second semiconductor material being AlInGaN.

Although the subject matter has been described in language specific to structural features and/or methodological acts, it is to be understood that the subject matter defined in the appended claims is not necessarily limited to the described features or acts described above, or the order of the acts described above. Rather, the described features and acts are disclosed as example forms of implementing the claims.

The present disclosure may be embodied in other specific forms without departing from its essential characteristics. The described embodiments are to be considered in all respects only as illustrative and not restrictive. All changes which come within the meaning and range of equivalency of the claims are to be embraced within their scope.

When introducing elements in the appended claims, the articles "a," "an," "the," and "said" are intended to mean there are one or more of the elements. The terms "comprising," "including," and "having" are intended to be inclusive and mean that there may be additional elements other than the listed elements.

What is claimed is:

1. A heterojunction structure comprising:

a channel semiconductor layer formed of a first semiconductor material; and a barrier semiconductor layer epitaxially deposited on the channel semiconductor layer to form a heterojunction between the channel semiconductor layer and the barrier semiconductor layer;

the barrier semiconductor layer formed of a second semiconductor material that is a compound semiconductor material comprising multiple different elements, wherein for at least some of a thickness of the barrier semiconductor layer, a composition percentage of at least one of the multiple different elements decreases with an epitaxial depth within the barrier semiconductor layer, the decrease decelerating with depth, and beginning from a percentage greater than 50 percent.

2. The heterojunction structure in accordance with claim 1, the first semiconductor material being GaN, and the second semiconductor material being AlGaN.

3. The heterojunction structure in accordance with claim 1, the first semiconductor material being GaN, and the second semiconductor material being AlInGaN.

4. The heterojunction structure in accordance with claim 1, the composition percentage decreasing with the epitaxial depth within the barrier semiconductor layer for all of the epitaxial depth of the barrier semiconductor layer.

5. The heterojunction structure in accordance with claim 1, the composition percentage decreasing with the epitaxial depth within the barrier semiconductor layer for only some of the epitaxial depth of the barrier semiconductor layer.

6. The heterojunction structure in accordance with claim 1, the composition percentage decreasing with the epitaxial depth within the barrier semiconductor layer for the epitaxial depth of the barrier semiconductor layer except at a portion that is most proximate the channel semiconductor layer.

7. The heterojunction structure in accordance with claim 1, the channel semiconductor layer being a first channel semiconductor layer, the barrier layer being a first barrier semiconductor layer, the heterojunction comprising a first heterojunction, the heterojunction structure further comprising:

a second semiconductor channel layer formed of a third semiconductor material; and a second barrier semiconductor layer epitaxially deposited on the second channel semiconductor layer to form a second heterojunction between the second channel semiconductor layer and the second barrier semiconductor layer;

the second barrier semiconductor layer formed of a fourth semiconductor material that is a compound semiconductor material comprising multiple different elements, wherein for at least some of the thickness of the second barrier semiconductor layer, a composition percentage of at least one of the multiple different elements of the second barrier semiconductor layer changes depending on an epitaxial depth within the second barrier semiconductor layer.

8. The heterojunction structure in accordance with claim 7, the third semiconductor material and the first semiconductor material being a same first compound semiconductor material with the same or different component percentages, the second semiconductor material and the fourth semiconductor material being a same second compound semiconductor material.

9. The heterojunction structure in accordance with claim 8, a component percentage of at least some of multiple elements of the second compound semiconductor material varying with epitaxial depth in the first barrier layer in a different manner as a component percentage of the at least one of the multiple elements of the second compound semiconductor material varies with epitaxial depth in the second barrier semiconductor layer.

10. A method for forming a heterojunction structure that is composed of an epitaxial stack, the method comprising:

an act of forming a channel semiconductor layer composed of a first semiconductor material; and an act of epitaxially growing a barrier semiconductor layer on the channel semiconductor layer to form a heterojunction between the channel semiconductor layer and the barrier semiconductor layer, the barrier semiconductor layer formed of a second semiconductor material that is a compound semiconductor material comprising multiple different elements, wherein for at least part of the epitaxial growth of the barrier semiconductor layer, a composition of at least one of the multiple different elements decreases with time of epitaxial growth and thus decreasing with epitaxial depth, the decrease decelerating with time and epitaxial depth, and beginning from a percentage greater than 50 percent.

11. The method in accordance with claim 10, the first semiconductor material being GaN, and the second semiconductor material being AlGaN.

12. The method in accordance with claim 10, the first semiconductor material being GaN, and the second semiconductor material being AlInGaN.

13. The method in accordance with claim 10, the channel semiconductor layer being a first channel semiconductor layer, the barrier layer being a first barrier semiconductor layer, the heterojunction comprising a first heterojunction, the method further comprising forming the epitaxial stack by performing:

an act of forming a second semiconductor channel layer formed of a third semiconductor material; and an act of epitaxially depositing a second barrier semiconductor layer on the second channel semiconductor layer to form a second heterojunction between the second channel semiconductor layer and the second barrier semiconductor layer, the second barrier semiconductor layer formed of a fourth semiconductor material that is a second compound semiconductor material comprising multiple different elements, wherein for at least part of the epitaxial growth of the second barrier semiconductor layer, a composition of at least one of the multiple different elements of the second barrier semiconductor layer is adjusted so as to vary with time of epitaxial growth.

* * * * *